United States Patent
Jones et al.

(10) Patent No.: US 6,916,669 B2
(45) Date of Patent: Jul. 12, 2005

(54) SELF-ALIGNED MAGNETIC CLAD WRITE LINE AND ITS METHOD OF FORMATION

(75) Inventors: Robert E. Jones, Austin, TX (US); Carole C. Barron, Austin, TX (US); Eric D. Luckowski, Round Rock, TX (US); Bradley M. Melnick, Austin, TX (US)

(73) Assignee: Freescale Semiconductor, Inc.

( * ) Notice: Subject to any disclaimer, the term of this patent is extended or adjusted under 35 U.S.C. 154(b) by 0 days.

(21) Appl. No.: 10/378,348

(22) Filed: Mar. 3, 2003

(65) Prior Publication Data

US 2003/0151079 A1 Aug. 14, 2003

Related U.S. Application Data

(62) Division of application No. 09/713,734, filed on Nov. 15, 2000, now Pat. No. 6,555,858.

(51) Int. Cl.[7] .......................... H01L 21/00; H01L 21/20
(52) U.S. Cl. .......................... 438/3; 438/238; 438/381; 438/622
(58) Field of Search ........................... 438/3, 238, 295, 438/381, 622

(56) References Cited

U.S. PATENT DOCUMENTS

| | | | | |
|---|---|---|---|---|
| 3,699,619 A | | 10/1972 | Yasuda | 29/604 |
| 4,935,263 A | * | 6/1990 | Satoh et al. | 427/126.1 |
| 5,529,814 A | * | 6/1996 | Tan et al. | 427/547 |
| 5,640,343 A | | 6/1997 | Gallagher | 365/171 |
| 5,641,694 A | * | 6/1997 | Kenney | 438/156 |
| 5,659,499 A | | 8/1997 | Chen | 365/158 |
| 5,668,686 A | * | 9/1997 | Shouji et al. | 360/319 |
| 5,702,831 A | | 12/1997 | Chen | 428/611 |
| 5,768,181 A | | 6/1998 | Zhu | 365/158 |
| 5,939,788 A | * | 8/1999 | McTeer | 257/751 |
| 5,940,319 A | | 8/1999 | Durlam | 365/171 |
| 5,946,228 A | | 8/1999 | Abraham | 365/173 |
| 5,956,267 A | | 9/1999 | Hurst | 365/158 |
| 6,054,329 A | | 4/2000 | Burghartz | 438/3 |
| 6,153,443 A | * | 11/2000 | Durlam et al. | 438/3 |
| 6,171,693 B1 | * | 1/2001 | Lubitz et al. | 428/332 |
| 6,174,737 B1 | | 1/2001 | Durlam | 438/3 |
| 6,211,090 B1 | | 4/2001 | Durlam | 438/692 |
| 6,214,731 B1 | * | 4/2001 | Nogami et al. | 438/687 |
| 6,218,290 B1 | * | 4/2001 | Schonauer et al. | 438/633 |
| 6,303,392 B1 | * | 10/2001 | Matsukuma | 438/3 |
| 6,348,709 B1 | * | 2/2002 | Graettinger et al. | 257/311 |
| 6,358,756 B1 | * | 3/2002 | Sandhu et al. | 438/3 |
| 6,413,788 B1 | * | 7/2002 | Tuttle | 438/3 |
| 6,419,845 B1 | * | 7/2002 | Sasaki | 216/22 |
| 6,475,812 B2 | * | 11/2002 | Nickel et al. | 438/3 |
| 6,555,858 B1 | * | 4/2003 | Jones et al. | 257/295 |

FOREIGN PATENT DOCUMENTS

| | | | | |
|---|---|---|---|---|
| JP | 58-115625 | * | 7/1983 | G11B/5/42 |
| WO | WO 02/41367 A2 | | 5/2002 | |
| WO | WO 02/084755 A2 | | 10/2002 | |

OTHER PUBLICATIONS

Debear et al, "Spin–etch Planarization for Dual Damascene Interconnect Structures," Solid State Technology, Mar. 2000, pp. 53–60.

* cited by examiner

Primary Examiner—T. N. Quach
(74) Attorney, Agent, or Firm—Kim-Marie Vo

(57) ABSTRACT

A self-aligned magnetic clad bit line structure (274) for a magnetic memory element (240a) and its method of formation are disclosed, wherein the self-aligned magnetic clad bit line structure (274) extends within a trench (258) and includes a conductive material (264), magnetic cladding sidewalls (262) and a magnetic cladding cap (252). The magnetic cladding sidewalls (262) at least partially surround the conductive material (264) and the magnetic cladding cap (252) is substantially recessed within the trench with respect to the top of the trench.

16 Claims, 8 Drawing Sheets

SELF-ALIGNED MAGNETIC CLAD WRITE LINE AND ITS METHOD OF FORMATION

This application is a divisional of application Ser. No. 09/713,734, filed Nov. 15, 2000, now U.S. Pat. No. 6,555,858.

FIELD OF THE INVENTION

The present invention relates generally to a magnetic random access memory (MRAM) device and a fabricating method thereof, and more particularly to a MRAM device write line structure

RELATED ART

Magnetic random access memory (MRAM) technology development is currently underway for use as a type of non-volatile memory by the semiconductor industry. MRAM may also prove useful as dynamic random access memory (DRAM) or static random access memory (SRAM) replacements. There are two main types of MRAM: MTJ (magnetic tunnel junction) and GMR (giant magnetoresistive) MRAM. FIG. 1 shows a portion, or a memory bit, of an MTJ array 10 which includes a write line or a bit line 12 intersected by a number of digit lines 14. At each intersecting write line and digit line, a magnetic tunnel junction sandwich 16 forms a memory element in which one "bit" of information is stored. The magnetic tunnel junction sandwich 16 is comprised of a non-magnetic material 18 between a magnetic layer of fixed magnetization vector 20 and a magnetic layer in which the magnetization vector can be switched 22; these will be referred to as a fixed layer 20 and a free or switching layer 22.

It is advantageous for a variety of reasons to increase the packing density of memory cells in the memory array. A number of factors influence packing density; they include memory element size and the relative dimensions of associated memory cell circuitry, i.e. bit lines and digit lines, and any semiconductor switching or access device within the memory cell. For example, referring to FIG. 2, a cross-sectional view of a portion of a prior art MRAM write line structure 100 is shown. (The write line structure 100 can be a bit line structure in an MTJ array or a word line structure in a GMR array.) The write line structure 100 includes a conductive material 104 surrounded by magnetic cladding members 103 and 106. The magnetic cladding members 103 are formed using high-permeability materials that have magnet domains in the plane of the cross-section shown in FIG. 2 which are magnetized and demagnetized upon the application and removal of an applied magnetic field. When current is applied through the conductive material 104, the corresponding magnetic fields associated with the magnetic cladding members 103 and 106 help to enhance the magnitude and more effectively focus the overall magnetic field associated with the write line structure 100 toward its associated memory element (not shown). Additionally, the magnetic cladding members 103 and 106 also help to shield the bit line's magnetic field from memory cells associated with other write lines, thereby protecting their programming state information.

The prior art method for forming the write line structure 100 includes first etching a trench 102 in the dielectric layer 101. Next, a layer of a high-permeability magnetic material, such as a layer of an alloy of nickel-iron (NiFe), is deposited over the dielectric layer 101 and in the trench 102. The layer of high-permeability magnetic material is then anisotropically etched to form magnetic cladding sidewall (spacer) members 103 adjacent the trench sidewalls. After forming the magnetic cladding sidewall members 103, a conductive material 104, such as copper or aluminum, is deposited overlying the dielectric layer 103 and within the trench opening 102. Then, portions of the conductive material 104 not contained within the opening 102 are removed using a chemical mechanical polishing (CMP) process. Finally, an overlying layer of high-permeability magnetic material is deposited, patterned, and etched to form the magnetic cladding capping member 106.

The magnitude of the magnetic field at the location of the memory element is enhanced by the presence of the cladding, thus less current is required in the conductive material 104. Because the magnetic cladding capping member 106 is formed overlying the trench 102, it must be patterned and etched having a width dimension Z which is yet greater than the trench 102 width dimension X. Moreover, alignment of the magnetic cladding capping member 106 to the trench 102 can be critical. Failure to properly align the magnetic cladding capping member 106 over the trench 102 can result in less-than-optimal magnetic fields being generated by the bit line or the undesirable exposure of adjacent circuitry to uncontained magnetic fields. Thus, the dimension Z of the magnetic cladding capping member 106 must additionally be upsized to take into account any alignment tolerance error. Therefore, an ability to reduce the dimension Z of the magnetic cladding capping member 106 can correspondingly improve the scalability of the MRAM array packing density.

BRIEF DESCRIPTION OF THE FIGURES

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

An embodiment of the present invention will now be discussed in further detail with respect to the accompanying figures.

In accordance with an embodiment of the present invention, a magnetic random access memory (MRAM) and its method of formation are disclosed. FIGS. 3–13 illustrate cross-sectional views of fabricating an MRAM device that includes magnetic memory elements, transistors for switching the electrical connections to the magnetic memory elements in reading operations, and associated magnetic memory element digit line and bit line circuitry.

Figure 1:
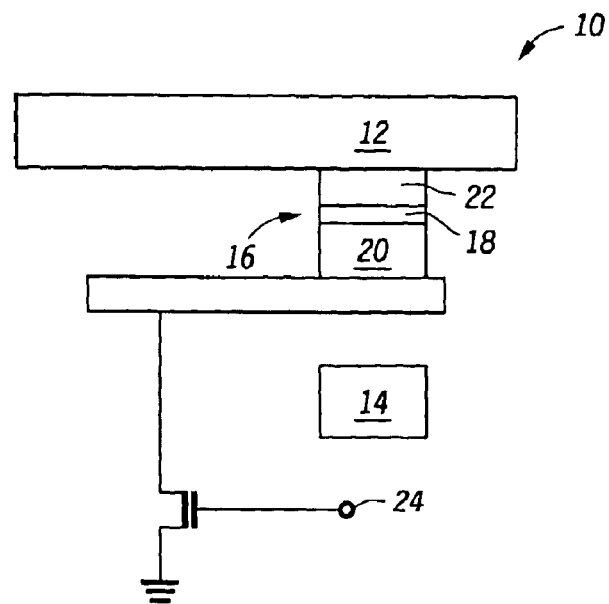
FIG. 1 includes a cross-sectional diagram illustrating a portion of a prior art MTJ MRAM array.
Figure 2:
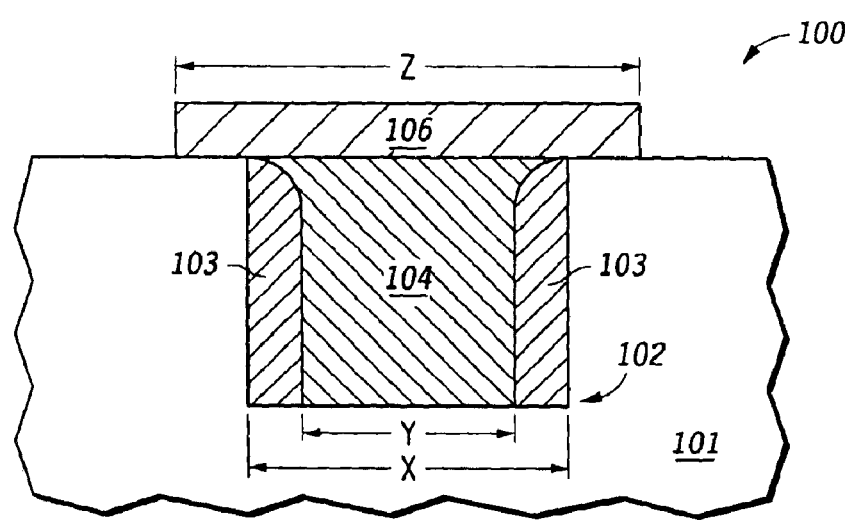
FIG. 2 includes a cross-sectional diagram illustrating of a prior art MRAM write line structure.
Figure 3:
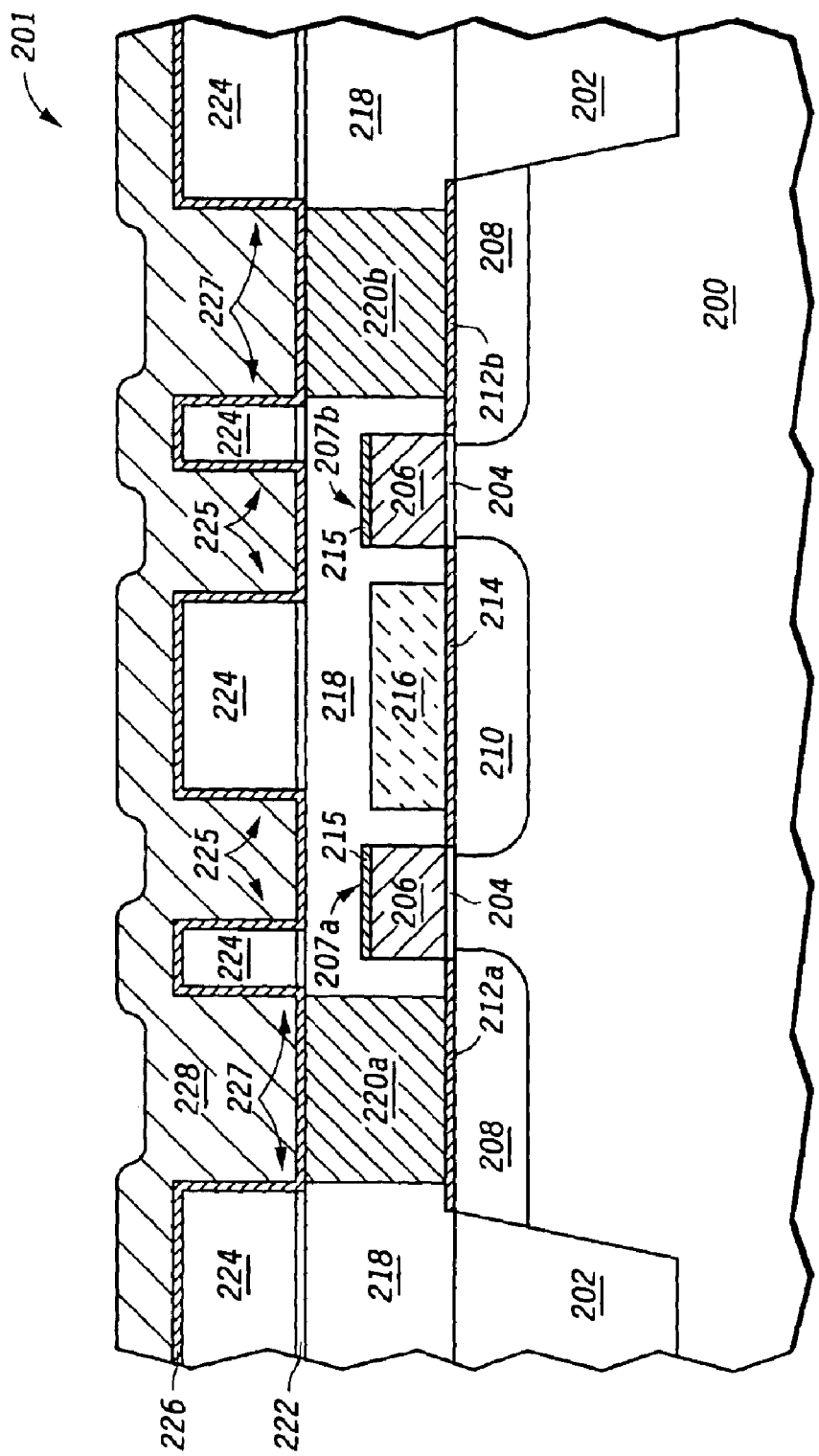
FIGS. 3–6 includes illustrations of cross-sectional views showing the fabrication of a portion of an MRAM array.

Referring to FIG. 3, a cross-sectional view that includes a partially fabricated MRAM device 201 is illustrated. The MRAM device 201 includes a mono-crystalline substrate 200 (or other suitable substrate, such as silicon on insulator (SOI) or the like), isolation regions 202, and switching transistors 207a and 207b. In accordance with one non-limiting embodiment, the mono-crystalline substrate 200 is a P-type silicon substrate and the switching transistors 207a and 207b are NMOS transistors. Switching transistors 207a and 207b further comprise N-type doped regions 208 and 210, gate dielectric layers 204, and gate electrode layers 206. The gate electrode layers 206 also form the word lines which run parallel to the digit line in this embodiment (not shown in FIG. 3). NMOS switching transistors 207a and 207b are fabricated using conventional CMOS processes. Other circuit elements, for example, input/output circuitry, data/address decoders, and comparators, may be contained in the MRAM device, however they are omitted from the drawings for simplicity.

In one embodiment, after forming the switching transistors 207a and 207b, the surface of the N-type doped regions 208 and 210 and the surface of the switching transistors 207a and 207b are silicided to form the regions 212a, 212b, 214 and 215. In a read operation of a memory cell, a positive voltage must be applied to the drain region 210 of the switching transistors 207a and 207b. This is accomplished by having a sense line in contact with the drain regions of all transistor pairs along a particular row of the array. This sense line is parallel to the word and digit line in the present embodiment.

In one embodiment the sense line can be formed by connecting adjacent drain regions 210 and associated silicide regions 214. Alternatively, these drain regions can be connected by a separate conductor. In the embodiment shown in FIG. 3, the sense line is the conductive member 216 which is formed overlying silicided region 214. In accordance with one embodiment, the conductive member 216 is a layer of tungsten that has been formed using a conventional inlaid process. Conductive member 216 provides a sense current to subsequently formed magnetic memory elements through transistors 207a and 207b. An explanation regarding the formation of magnetic memory elements will be explained hereinafter. In yet another embodiment, the sense line can be formed from a series of contact windows and contact plugs to the individual drain regions 210 and formation of a separate conductor line.

An interlevel dielectric (ILD) layer 218 is then formed overlying the substrate surface (Note, when used in this context "substrate surface" includes the semiconductor device substrate as well as all layers fabricated on the semiconductor device substrate up to the point of processing under discussion. Therefore, substrate surface refers to the present uppermost surface of the substrate, including all structures formed thereon). In one embodiment the ILD layer 218 is a silicon dioxide containing material deposited by chemical vapor deposition (CVD) using tetraethoxysilane (TEOS) as a gas source. Alternatively, ILD layer 218 may be a layer of silicon nitride, a layer of phosphosilicate glass (PSG), a layer of borophosphosilicate glass (BPSG), a spin on glass (SOG) layer, a layer of silicon oxynitride (SiON), a polyimide layer, a layer of a low-k dielectric material (for the purposes of this specification a low-k dielectric material or low dielectric constant material is any material having a dielectric constant less than approximately 3.6), or the like. Deposition can occur alternatively, by physical vapor deposition (PVD), a combination of PVD and CVD, or the like.

Conductive plugs 220a and 220b, which provide conduction of sense currents to the subsequently formed magnetic memory elements, are then formed within the ILD layer 218 and interconnect to the silicided regions 212a and 212b. In accordance with one embodiment, most circuit elements of the MRAM device, with the exception of the magnetic memory elements, digit lines, bit lines (if applicable), and write lines are integrated onto the substrate 200 before forming the conductive plugs 220a and 220b. In one embodiment the conductive plugs 220a and 220b comprise an adhesion/barrier layer (not shown) and a plug fill material. The adhesion/barrier layer is typically a refractory metal, such as tungsten (W), titanium (Ti), tantalum (Ta), and the like, a refractory metal nitride, or a combination of refractory metals or their nitrides. The plug fill material is typically tungsten, aluminum, copper, or a like conductive material. The adhesion/barrier layer and plug fill material can be deposited using PVD, CVD, electroplating processes, combinations thereof, or the like. After depositing the adhesion/barrier layer and the plug fill material, the substrate surface is polished to remove portions of the adhesion/barrier layer and plug fill material not contained within the opening to form the conductive plugs 220a and 220b shown in FIG. 3.

Figure 4:
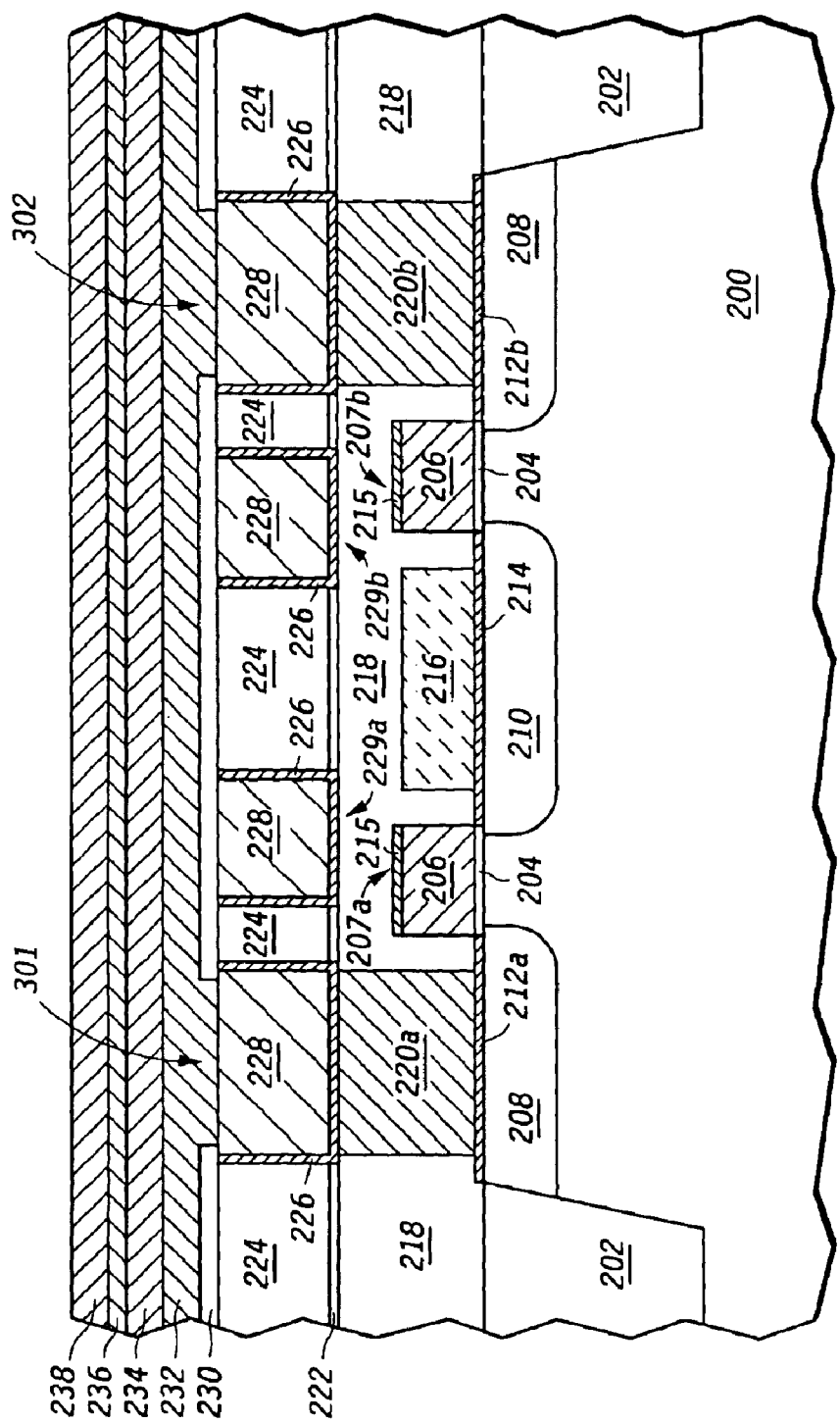

After forming the conductive plugs 220a and 220b, digit lines for the subsequently formed magnetic memory elements are defined. As shown in FIG. 4, an etch stop layer 222 and ILD layer 224 are formed over the substrate surface. In one embodiment, the etch stop layer 222 is a layer of CVD deposited silicon nitride. Alternatively, other materials such as aluminum nitride or aluminum oxide and other deposition methods, such as PVD or combinations of CVD and PVD can be used to form the etch stop layer 222. The ILD layer 224 can be formed using any of the materials or processes previously described to form the ILD layer 218. In accordance with one embodiment, the ILD layer 224 is a layer of CVD silicon dioxide having a thickness in a range of approximately 300–600 nanometers.

Next, the substrate surface is patterned and etched using conventional processes to define trenches 225 and contact window openings 227 within the ILD layer 224. The etch process then uses a chemistry which etches the etch stop layer 222 so that the contact window openings 227 extend to the conductive plugs 220a and 220b. In an alternate embodiment, if an endpoint etching process or a well controlled timed etch process is used to form the trenches and contact window openings, the use of the etch stop layer 222 may not be necessary.

Next, a relatively thin layer of high-permeability magnetic material 226 is deposited overlying the substrate surface. Typically, the layer of high-permeability material 226 includes an alloy material, such as nickel-iron (NiFe). In accordance with one embodiment, the thickness of the layer of high-permeability magnetic material 226 is in a range of approximately 5–40 nanometers. To improve adhesion of the magnetic field focusing layer 226 or to provide a barrier to prevent species of the high-permeability material from diffusing into the ILD layer 224, a layer of titanium nitride, tantalum, tantalum nitride, or other such material can be formed between the layer of high-permeability magnetic material 226 and the ILD layer 224.

A conductive layer 228 is then deposited over the layer of high-permeability magnetic material 226 to substantially fill the trenches 225 and contact window openings 227 and form the structure as shown in FIG. 3. In accordance with one embodiment, the conductive layer 228 is a layer of copper, which includes a PVD deposited seed layer (not shown) and an electroplated overlayer. Alternatively, the conductive layer 228 can be formed using other materials such as aluminum, aluminum alloys, copper alloys, or combinations thereof. To improve adhesion of the layer of high-permeability material 226 or to provide a barrier protection, a layer of titanium nitride, tantalum, tantalum nitride, or the like can formed between the magnetic field focusing layer 226 and the conductive layer 228.

Turning now to FIG. 4, after depositing the conductive layer 228, portions of the conductive material 228 and magnetic field focusing layer 226 not contained within the trench openings 225 and the contact window openings 227 are removed and the substrate surface is planarized using a conventional CMP process. At this point, digit lines 229a and 229b have substantially been formed. Digit lines 229a and 229b are partially surrounded by remaining portions of high-permeability layers 226. These remaining portions of high-permeability layer 226 help to reduce the digit line's magnetic flux leakage and to focus the digit line's magnetic fields towards overlying magnetic memory elements that will subsequently be formed.

A dielectric layer 230 is then deposited overlying the substrate surface, including over digit lines 229a and 229b. A CMP process may be used to planarize the upper surface of dielectric layer 230 The dielectric layer 230 is patterned and etched to form openings 301 and 302 as shown in FIG. 3. Next, a conductive layer 232 is deposited over dielectric layer 230. Dielectric layer 230 electrically isolates the digit lines 229a and 229b from the conductive layer 232. In accordance with one embodiment, the thickness of the conductive layer 232 is in a range of approximately 40–60 nanometers. After depositing the conductive layer 232, the substrate surface can be planarized using a polishing process.

Next, magnetic memory element layers 234, 236 and 238 are deposited over the conductive layer 232. The memory element layers 234, 236 and 238 can be deposited using PVD, ion beam deposition (IBD), CVD, combinations thereof, or the like. The bottom magnetic memory element layer 234 and the top magnetic memory layer utilize magnetic materials, such as NiFe, CoFe, NiFeCo, and the like. The middle memory element layer 236 typically comprises a thin tunnel dielectric material such as aluminum oxide ($Al_2O_3$), in a MTJ array, and copper (Cu) in a GMR array. In one embodiment, memory element layer 236 is formed by first depositing an aluminum film over bottom magnetic layer 234 and then oxidizing the aluminum film using an oxidation source, such as an RF oxygen plasma. Alternatively, aluminum oxide is deposited on layer 234 which may then be followed by a subsequent process in a heated or unheated oxygen ambient to ensure complete oxidation of the aluminum. The thicknesses of magnetic memory element layers 234 and 238 are typically in a range of approximately 2–20 nanometers. The thickness of the memory element layer 236 is typically in a range of approximately 1–3 nanometers. One of the magnetic memory element layers 234 and 238 must form the fixed layer and the other the free layer. In the preferred embodiment the bottom magnetic memory layer 234 is the fixed layer and the top magnetic layer 238 is the free layer. Formation of the fixed and free layers can follow materials and structures known in the art. The fixed layer can use a magnetic material with a higher coercive field than that of the free layer material. Alternatively, geometrical effects such as thickness or length-to-width aspect ratios can be used to make the free layer easier to switch than the fixed layer. Multilayer stacks such as a nonmagnetic or antiferromagnetic layers sandwiched between two magnetic layers with opposite magnetization vectors also can be used to form the fixed layer. Multilayer stacks (for example, of CoFe with NiFe) also can be used to form the free layer.

Figure 5:
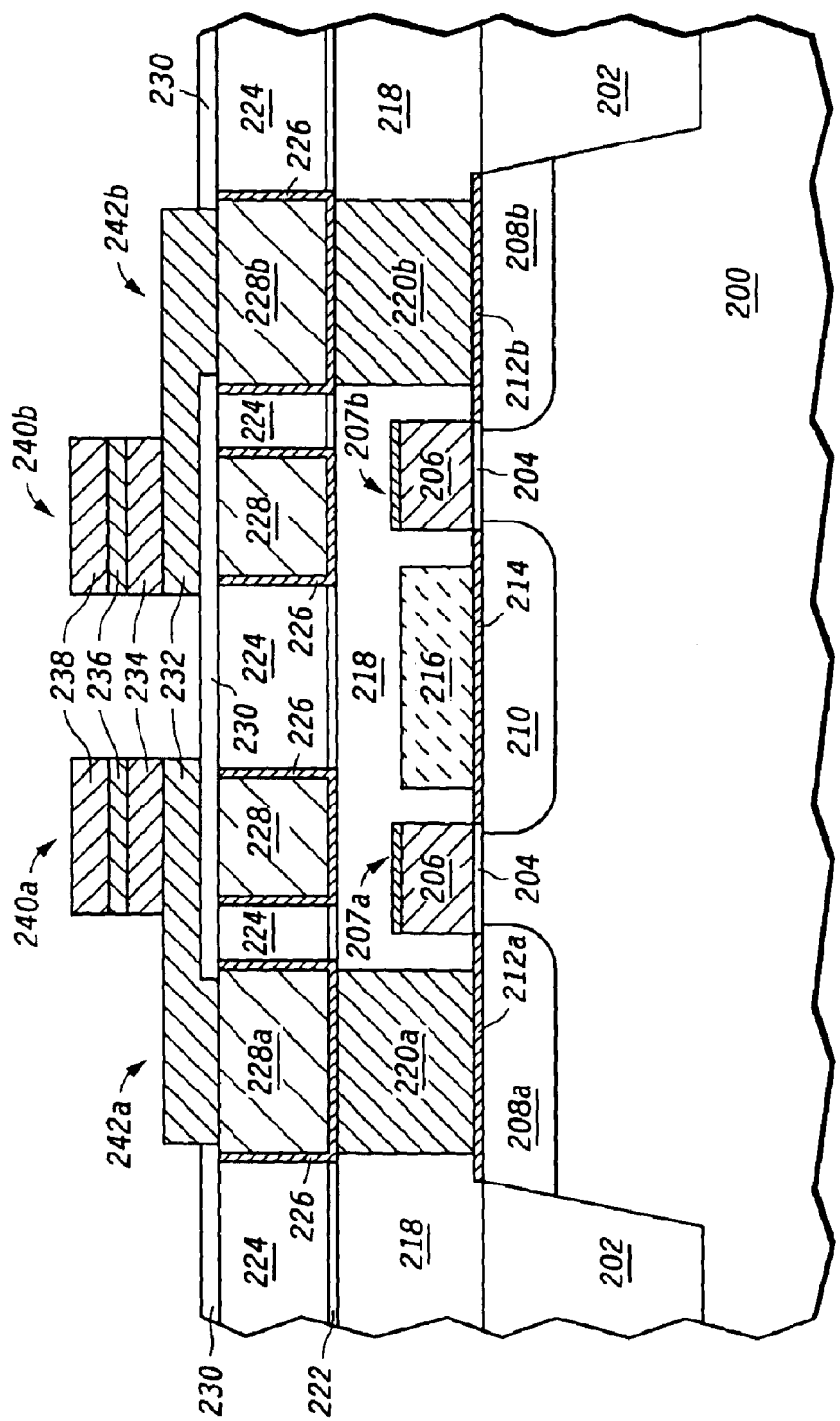

Turning now to FIG. 5, the substrate surface is patterned and etched to form magnetic memory elements 240a and 240b from remaining portions of memory element layers 234, 236 and 238 and to form conductive members 242a and 242b from remaining portions of conductive layer 232. The conductive member 242a interconnects magnetic memory element 240a to transistor 207a via conductive plug 220a and conductive member 228a, and the conductive member 242b interconnects magnetic memory element 240b to transistor 207b via conductive plug 220b and conductive member 228b.

Figure 6:
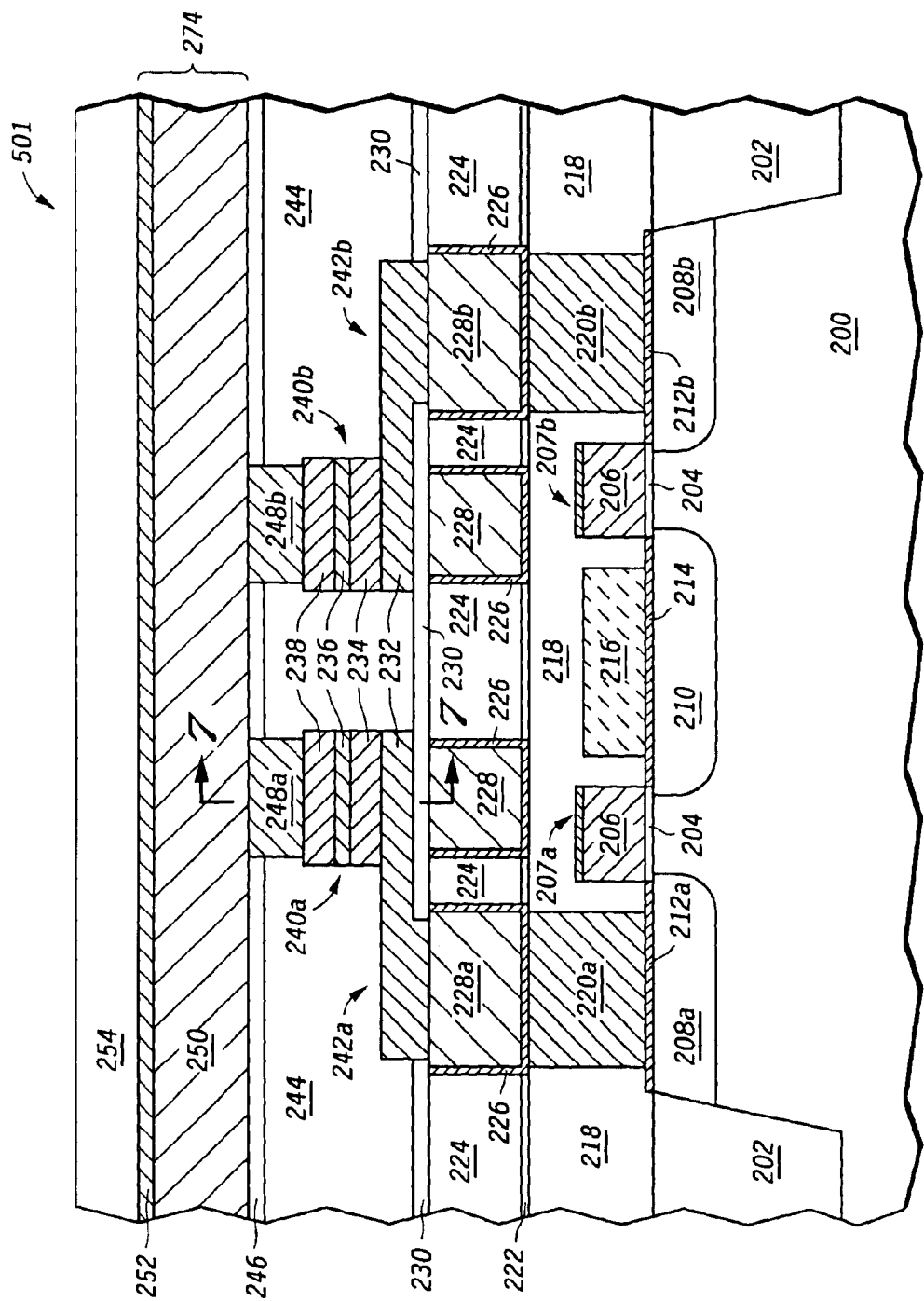

Referring now to FIG. 6, in accordance with one embodiment, after forming the magnetic memory elements 240a and 240b and conductive members 242a and 242b, an ILD layer 244 is deposited over the substrate surface. In the preferred embodiment a CMP process will be used to planarize ILD layer 224. Then etch stop layer 246 is deposited overlying the ILD layer 244. Then, portions of the etch stop layer 246 and ILD layer 244 overlying magnetic memory elements 240a and 240b are removed to define openings that expose portions of the magnetic memory elements 240a and 240b. Next, conductive layer 248 is deposited over the substrate surface and within the openings. Then the conductive layer is polished to form conductive members 248a and 248b as shown in FIG. 6. One of ordinary skill in the art recognizes that up to this point, the process of fabricating the MRAM device has been conventional to one of ordinary skill in the art. Although processing of the MTJ device has been described, one skilled in the art appreciates that a GMR device using the present invention can be fabricated using known methods up to this point, as well.

Referring now to FIGS. 6 and 7–13, an embodiment of the present invention will be discussed in further detail. FIG. 6 includes a cross section of a substantially completed MRAM device 501. The cross-section extends substantially along the same axis as a length of the bit line structure 274 and shows that the bit line structure 274 electrically connects to the magnetic memory elements 240a and 240b. The bit line structure 274 is a magnetically clad bit line structure that includes conductive material 250 and a self-aligned magnetic cladding capping layer 252. Overlying the bit line structure 274 is a passivation layer 254.

FIGS. 7–13 include an enlarged cross-sectional view illustrating a sequence of processing steps used to fabricate an embodiment of the present invention, which includes the self-aligned magnetic clad bit line for the MRAM device 501 shown in FIG. 6. The views shown in FIGS. 7–13 include a cross-section through the dielectric layer 230 and the conductive member 248a as indicated by the arrows 7—7 of FIG. 6.

Figure 7:
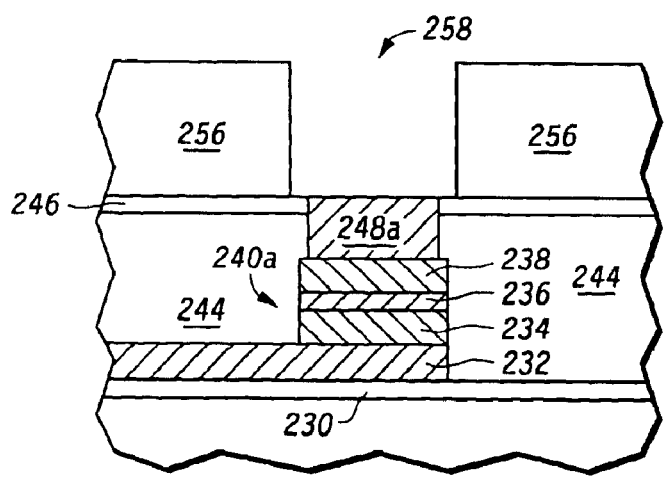
FIGS. 7–14 include cross-sectional illustrations of an embodiment of the present invention showing formation of a bit line structure used by memory cells in the MRAM array shown in FIG. 6.

Referring now to FIG. 7, after forming the conductive members 248a and 248b (248b not shown in FIG. 7) an ILD layer 256 is formed over the etch stop layer (the ILD layer 256 is not shown in FIG. 6 due to the orientation of the cross-section). In one embodiment, the ILD layer 256 has a thickness of approximately 300–600 nm and is a silicon dioxide based material deposited by CVD and formed using TEOS as a source gas. Alternatively, ILD layer 256 can be a layer of silicon nitride, a layer of PSG, a layer of BPSG, a SOG layer, a layer of SiON, a polyimide layer, a layer of a low-k dielectric material, a combination of the forgoing materials, or the like.

After depositing the ILD layer 256, the substrate surface is patterned and etched to form a trench 258 in the ILD layer 256. As shown in FIG. 7, the trench 258 is substantially aligned with the conductive member 248a and the magnetic memory element 240a. Although not shown in FIG. 7, the trench extends in a direction, such that it also substantially aligns with other magnetic memory elements associated with the bit line structure 274, shown in FIG. 6.

Figure 8:
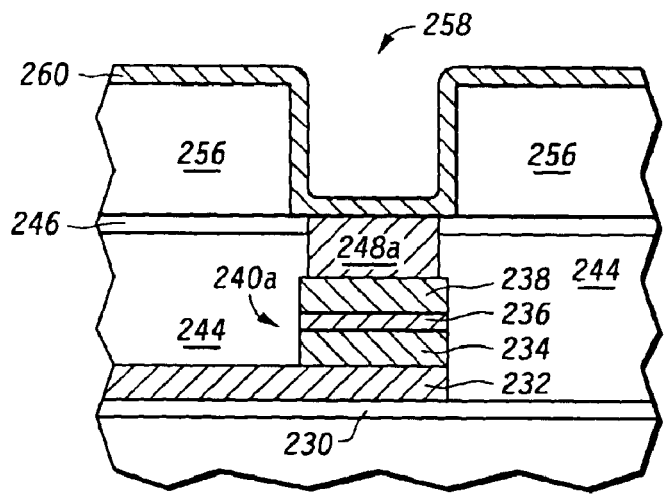

Next, a layer of a high-permeability magnetic material 260 is deposited over the ILD layer 256 and within the trench 258 as shown in FIG. 8. In accordance with one embodiment, the layer of high-permeability magnetic material layer 260 includes NiFe. Alternatively, the layer of high-permeability magnetic material can be a layer of NiFeCo. Typically, the layer of high-permeability magnetic material 260 is deposited using PVD. Alternatively, CVD, electroplating, electroless plating, or the like can also be used to form the layer of high-permeability magnetic material 260. Typically, the thickness of the layer of high-permeability magnetic material 260 is in a range of approximately 5–40 nm. One of ordinary skill in the art realizes that as technology advances, the trench dimensions may shrink. If the trench shrinks, the thickness of high-permeability magnetic material 260 may not be within the 5–40 nm range. If this is the case, another thickness, which does not fill the trench, should be chosen.

Figure 9:
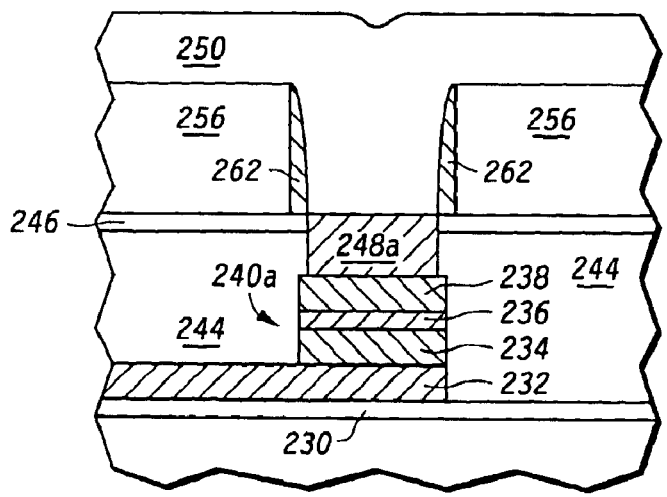
Figure 10:
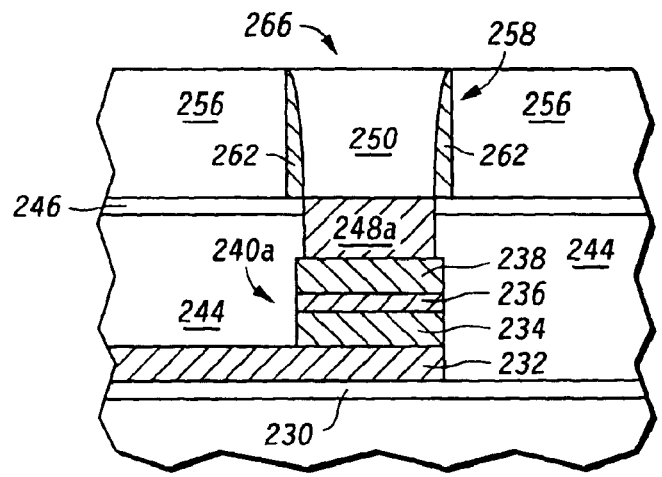

Next, the high-permeability layer 260 is anisotropically etched to form spacers (magnetic cladding sidewall members) 262 adjacent sidewalls of the trench opening 258, as shown in FIG. 9. In one embodiment, the layer of a high permeability layer 260 is etched using a plasma etch process chemistry. This plasma etch may include chlorine (Cl) based chemistries, or argon (Ar) based chemistries, or combinations of such chemistries. Such etch chemistries may also include other gases such as nitrogen (N). Alternatively an ion milling process may be used to form the spacers.

After forming the magnetic cladding sidewall members 262, a layer of conductive material 250 is deposited overlying the substrate surface and within the trench opening 258 as shown in FIG. 9. The conductive material or layer 250 can be deposited using PVD, CVD, electroplating, electroless plating, or combinations thereof. Typically, the conductive material 250 has a thickness that substantially fills the trench. One of ordinary skill recognizes that this thickness requirement will vary as a function of the depth and width dimensions of the trench. In accordance with one embodiment, the conductive material 250 is a layer of copper. Alternatively, the conductive material 250 can include other materials such as copper alloys, aluminum, or aluminum alloys including aluminum-copper. Next, portions of conductive material 250 that are not contained within the trench 258 are removed and the substrate surface is planarized via CMP to form the structure shown in FIG. 10.

Figure 11:
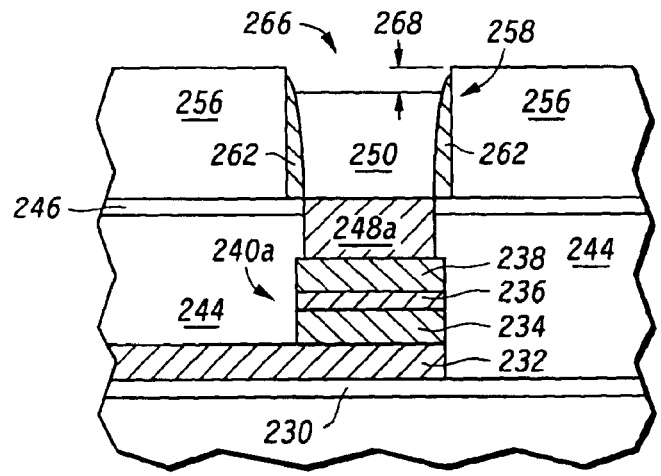
Figure 12:
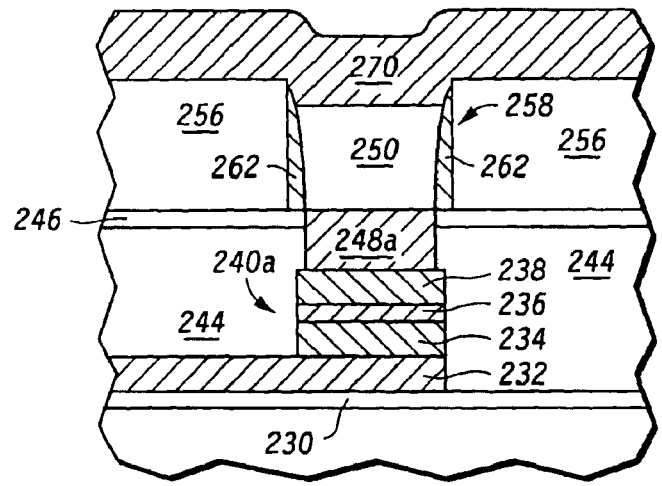

Referring now to FIG. 11, portions of the conductive material 250 within the trench 258 are removed to form a recess which extends below the uppermost portions of the trench 258 (i.e. the top surface portions of ILD layer 256). In accordance with one specific embodiment, the recess is formed using a reactive ion etch process or a wet etch process which removes portions of the conductive material 250 at a rate of approximately 3–5 times greater than it removes portions of the ILD layer 256. The etch also should not remove the magnetic cladding sidewall member 262 at a rate which is faster than the etch rate of the conductive layer 250. Typically, the amount of recess 268 is determined by the thickness requirements of a subsequently formed self-aligned magnetic cladding capping member as will be explained. In one embodiment the recess is formed using a wet etchant in a spin-etch process. In such a spin-etch process, the substrate is placed on a chuck, rotated at a speed of 1000–1200 rpm, and the etchant dispensed onto the substrate. The etch process is typically 10–60 seconds in duration. The actual etch step is typically followed by a 10–30 second spin-rinse step using deionized water in the same process tool as the spin-etch. The etchant chemistry employed depends on the composition of the conductive material 250. In one embodiment the conductive material is copper and the etchant may contain acids such as $HNO_3$, HCl, $H_2SO_4$, or combinations thereof. Alternatively, the present inventors have recognized that the removal and recessing of the conductive material 250 can also advantageously be accomplished using a single spin-etch process to planarize and recess the conductive material within the trench. Referring now to FIG. 12, after recessing the trench, a capping layer 270 that includes a high-permeability material such as NiFe is deposited overlying the substrate surface and within the recess 268 of trench 258. Alternatively, other materials having high permeability properties such as NiFeCo or CoFe can be used to form a magnetic clapping material or a capping layer 270. Typically, the magnetic capping material 270 has a thickness that is sufficient to fill the recess 268 in the trench 258. In accordance with one embodiment, the magnetic clapping material 270 is deposited using a PVD process. Alternatively the magnetic clapping material 270 can be formed using ion beam deposition (IBD), CVD, electroplating, combinations thereof, or the like.

Figure 13:
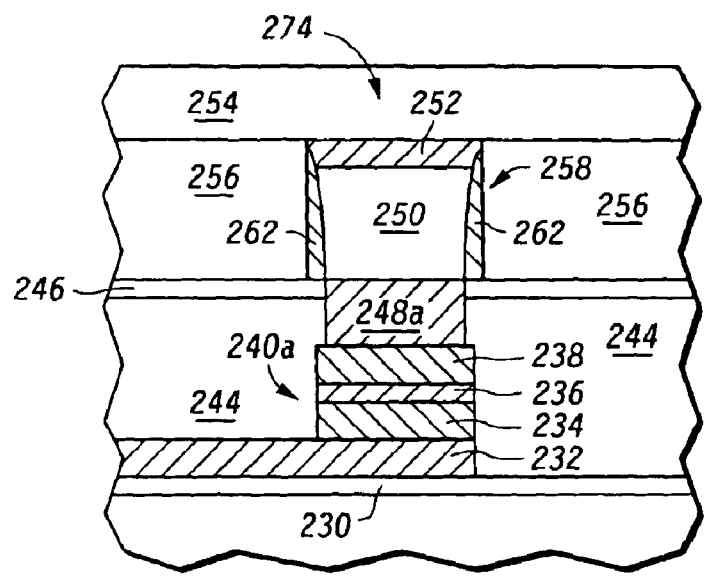

Referring now to FIG. 13, after depositing the magnetic cladding material 270, portions of the magnetic cladding material 270 not contained within the recess 268 of the trench opening 258 are removed to form a self-aligned magnetic cladding cap 252 within the recess 268. The removal of these portions can be accomplished, for example, using a CMP process or, alternatively, a planarization etchback process, as known to one of ordinary skill. The self-aligned magnetic cladding cap 252 or magnetic cladding material 270 is substantially recessed with respect to the top of the trench 258 or the dielectric layer 256. In one embodiment, substantially recessed is quantified to mean at least 90% within the trench. A dielectric barrier or passivation layer 254 can then deposited on the substrate surface by CVD, PVD, a combination of the two, or the like, to protect the substrate surface. Typically, the dielectric barrier is a silicon nitride ($SiN_x$). Alternatively, the dielectric barrier can be formed of silicon, oxygen, nitrogen and combinations of these materials. By forming the magnetic cladding cap 252 within the recess 268, the magnetic cladding cap structure 252 is advantageously self-aligned to the conductive material 250 and magnetic cladding sidewall spacers. The combination of the magnetic cladding sidewall spacers, conductive material 250, and magnetic cladding cap structure 252 forms the self-aligned magnetic clad bit line 274 for the MRAM memory element 240a shown in FIG. 6.

Figure 14:
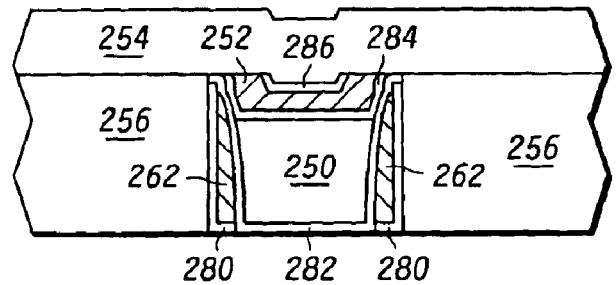

In an alternate embodiment, barrier layers 280, 282, 284 and 286, are formed, shown in FIG. 14, to limit diffusion between the materials on either side of the barrier. Barrier layer 280 is between the magnetic cladding sidewall spacers 262 and the ILD layer 256. Surrounding the conductive material 250 is barrier layer 282 which serves as a diffusion barrier between the conductive material 250 and the ILD layer 256 and the conductive material 250 and the magnetic cladding sidewall spacers 262. Below the magnetic cladding cap 252, barrier layer 284 serves as diffusion barrier of the cap 252 with the conductive material 250 and the magnetic cladding sidewall spacers 262. Diffusion can also be limited between the magnetic cladding cap 252 and the passivation layer 254, by forming barrier layer 286. Alternatively, the passivation layer may be an appropriate diffusion barrier and barrier layer 286 may not be required. One skilled in the art recognizes that any combination of the barrier layers 280, 282, 284 and 286 can be used. To form the barrier layers 280, 282, 284 and 286 the barrier materials can be deposited prior to depositing the magnetic cladding sidewall spacers 262, the conductive layer 250, the magnetic cladding cap 252 and the passivation layer 254, respectively. Typically, the barrier layers 280, 282, 284 and 286 are deposited using PVD. Alternatively, CVD, a combination of PVD and CVD, or the like can be used. After deposition of the barrier material, the processing flow previously discussed is followed starting with polishing or etching of the deposited layers. Typically, the thickness of the barrier material is approximately 5 to 20 nanometers. One skilled in the art recognizes that the choice of the barrier material depends on the materials on either side of barrier layers 280, 282, 283, and 284. In one embodiment the magnetic cladding cap 252 and the magnetic cladding sidewall spacer 262 can be comprised of NiFe, CoFe and NiFeCo, and the barrier layers 280, 282, 284, and 286 can be comprised of Ta, TiW, TiN, TaN, and the like.

Figure 15:
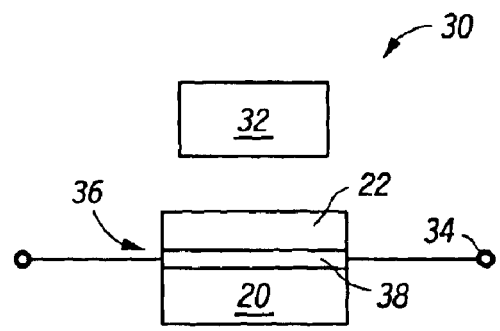
FIG. 15. includes a cross-sectional diagram illustrating a portion of a GMR MRAM array.

Although the present invention has been described in regards to an MTJ array, one of ordinary skill in the art will realize that the present invention can be used in other devices, particularly a GMR array. FIG. 15 shows GMR array 30. Write line 32, which is also a word line, includes the self-aligned magnetic cladding cap 252 of the present invention. A separate bit line 34 connects GMR memory element 36 in an array with other GMR memory elements. The nonmagnetic conductor 38 in the magnetic stack is usually a conductor in GMR arrays. As one skilled in the art knows, the GMR array 30 is read through the bit line 34.

Unlike the prior art write line structure, which forms the magnetic cladding capping structure overlying the trench, the present invention advantageously forms the magnetic cladding capping structure within the trench. This eliminates the need to upsize the dimensions of the magnetic cladding capping structure for alignment and magnetic field containment purposes. Therefore, the width dimensions of the magnetic cladding cap 252 can be scaled to dimensions which are substantially the same as the width dimensions of the trench and significantly smaller than the width dimensions of the prior art magnetic cladding capping structure. Accordingly, the memory cell size and scalability is no longer constrained by the magnetic cladding capping dimension requirements. In addition, because the cap 252 is self-aligned, processing steps to form the magnetic cladding capping structure, which include patterning, etching, and resist removal can advantageously be eliminated. Their elimination improves manufacturability by reducing cycle time, reducing potential for misprocessing, and reducing overall processing costs. In addition, the disclosed embodiments can be integrated into an existing process flow without the use of additional materials beyond those used in the prior art and with only limited changes in the processes and process equipment.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than restrictive sense, and all such modifications are intended to be included within the scope of the present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any of the claims.

What is claimed is:

1. A method for forming a semiconductor device comprising:

forming magnetic memory elements overlying a semiconductor device substrate;

forming a dielectric layer overlying the magnetic memory elements;

forming a trench opening within the dielectric layer;

forming magnetic cladding sidewall spacers on adjacent sidewalls of the trench;

forming a conductive bit line material within the trench;

forming a magnetic cladding cap within the trench and overlying the conductive bit line material; wherein portions of the magnetic cladding cap are substantially recessed with respect to a top surface of the dielectric layer, and wherein a combination of the conductive bit line material within the trench, the magnetic cladding sidewall spacers and the magnetic cladding cap form a clad bit line.

2. The method of claim 1, wherein forming a conductive bit line material within the trench further comprises:

depositing a layer of a conductive material overlying the substrate surface and within the trench opening;

removing portions of the conductive material not contained within the trench opening; and recessing portions of the conductive material within the trench opening below the top surface of the conductive layer.

3. The method of claim 2, wherein at least one of removing portions or the conductive material and recessing portions of the conductive material includes using spinetch process.

4. The method of claim 1, wherein the magnetic cladding sidewall spacers include NiFc.

5. The method of claim 1, wherein the magnetic cladding sidewall spacers include a material selected from a group consisting of NiFeCo, and CoFe.

6. The method of claim 1, wherein forming a magnetic cladding cap within the trench further comprises:

depositing a magnetic cladding layer overlying the substrate surface and within a recessed portion of the trench; and removing portions of the magnetic cladding capping layer not contained within the recessed portions of the trench.

7. The method of claim 6, wherein the depositing a magnetic cladding layer overlying the substrate surface further comprises placing the magnetic cladding layer.

8. The method of claim 7, wherein plating the magnetic cladding layer further comprises electrolessly plating the magnetic cladding layer.

9. The method of claim 1, wherein the magnetic cladding cap includes a NiFe material.

10. The method of claim 1, wherein the magnetic cladding cap includes a material selected from a group consisting of NiFeCo, and CoFe.

11. The method of claim 1, further comprising forming a conductive barrier material that at least partially surrounds the conductive bit line material and is interposed between the conductive bit line material and the magnetic cladding side wall spacers.

12. The method of claim 1, further comprising forming a conductive barrier material that at least partially surrounds the magnetic clad cap and the magnetic cladding sidewall spacers.

13. The method of claim 1, further comprising forming a conductive barrier material between the magnetic cladding sidewall spacers and the dielectric layer.

14. The method of claim 1, further comprising forming a dielectric barrier layer overlying the clad bit line.

15. The method of claim 14, wherein the dielectric barrier layer includes a material selected from a group consisting of silicon, oxygen and nitrogen.

16. The method of claim 1, wherein the magnetic cladding cap comprises an element selected from the group consisting of Ni, Fe and Co.

* * * * *

UNITED STATES PATENT AND TRADEMARK OFFICE
CERTIFICATE OF CORRECTION

| | | |
|---|---|---|
| PATENT NO. | : 6,916,669 B2 | Page 1 of 1 |
| APPLICATION NO. | : 10/378348 | |
| DATED | : July 12, 2005 | |
| INVENTOR(S) | : Robert E. Jones, Jr. | |

It is certified that error appears in the above-identified patent and that said Letters Patent is hereby corrected as shown below:

In Column 10, Line 43, Claim No. 3:

Change "or" to --of--

In Column 10, Line 62, Claim No. 7:

Change "placing" to --plating--

Signed and Sealed this

Seventeenth Day of October, 2006

JON W. DUDAS
*Director of the United States Patent and Trademark Office*